United States Patent [19]
Khanna et al.

[11] Patent Number: 6,081,136
[45] Date of Patent: Jun. 27, 2000

[54] DYNAMIC NOR GATES FOR NAND DECODE

[75] Inventors: Rajesh Khanna, Fremont; Hamid Partovi, Sunnyvale, both of Calif.

[73] Assignee: Advanced Micro Devices, Inc., Sunnyvale, Calif.

[21] Appl. No.: 08/993,335

[22] Filed: Dec. 19, 1997

[51] Int. Cl.[7] .............................................. H03K 19/003
[52] U.S. Cl. ............................ 326/95; 326/105; 326/103
[58] Field of Search .................................. 326/105, 106, 326/108, 93, 95, 98; 365/230.6

[56] References Cited

U.S. PATENT DOCUMENTS

| | | | |
|---|---|---|---|
| 5,023,838 | 6/1991 | Herbert | 326/105 |
| 5,144,582 | 9/1992 | Steele | 326/105 |
| 5,606,269 | 2/1997 | Pontius et al. | 326/93 |
| 5,909,567 | 6/1999 | Novak et al. | 395/384 |

*Primary Examiner*—Jon Santamauro
*Assistant Examiner*—Don Phu Le
*Attorney, Agent, or Firm*—Skjerven, Morrill, MacPherson, Franklin & Friel, L.L.P.; Marc R. Ascolese

[57] ABSTRACT

A NOR gate pair includes a first and second NOR gate, each with a plurality of inputs and an output. A first NAND gate has a first input coupled to the output of the first NOR gate, a second input coupled to the output of the second NOR gate through a first input inverter, and an output. A second NAND gate has a first input coupled to the output of the second NOR gate, a second input coupled to the output of the first NOR gate through a second input inverter, and an output. A first output inverter is coupled to the output of the first NAND gate and a second output inverter is coupled to the output of the second NAND gate. This configuration assures that NOR gates used in a one-hot-decode decoder will all have logic-low outputs during a precharge phase.

23 Claims, 5 Drawing Sheets

DYNAMIC NOR GATES FOR NAND DECODE

BACKGROUND OF THE INVENTION

1. Field of the Invention

This invention relates to NOR gate circuits, particularly decoder circuits with large fan-in for use in integrated circuits including memories and processors.

2. Description of the Related Art

A decoder uses one or more binary values, or addresses, to select between a number of outputs and to assert the selected output by placing it in its active state. Decoders can be constructed using a variety of logic gates. Decoders are commonly used in a wide variety of applications including, for example, interfacing to microprocessors to trigger different actions depending on the address; enabling a sequence of actions in turn according to an advancing address given by the output of a binary counter; and selecting individual memory elements, rows (word lines), or columns (bit lines) of memory arrays. Depending upon the application, decoders may be large, with a large number of address lines going into the decoder (i.e. large fan-in) and a correspondingly large number of decode lines going out of the decoder. For example, a 4:16 decoder has four address select inputs and sixteen decode outputs.

Additionally, circuit designers seeking to improve and extend the capabilities of integrated circuits, including memories an processors, have used a variety of decoder designs in order to improve execution speed, reduce power consumption, and reduce circuit size.

FIG. 1 is an example of a 2:4 NAND decoder, so called because of its use of NAND gates to accomplish the decoding function. Examples discussed in this specification will focus on 2:4 decoders for simplicity's sake. The decoder has two address input lines A and B and four decode lines R1, R2, R3, and R4. Complements of the input signals are produced by inverters 102 and 104. If signals A and B both represent a logic 0, (00 being the address for decode line R1) then NAND gate 106 receives logic 1 at both of its inputs and produces a logic 0 signal as output. Thus, this device is said to be active-low, because the active state is logic 0. Inverter 108 inverts the signal producing a logic 1 state at R1. Under the same input conditions, the remaining NAND gates resolve to logic 1, which in turn is inverted to the logic 0 state at decode outputs R2–R4. Similarly, inputs of 01, 10, and 11 would produce the logic 1 state at outputs R2, R3, and R4, respectively. This NAND decoder scheme is often referred to as a one-hot-decode because only one decode output (the selected output) is in the logic 1 state.

FIG. 2 shows an example of a dynamic logic implementation for the NAND gate and inverter 110 of FIG. 1. In operation of this circuit, when the clock signal φ is low (precharge phase), PMOS transistor 202 is conducting while the complementary NMOS transistor 204 is off, and the decode output line is precharged to the logic-high level of $V_{DD}$. When the clock signal φ becomes high (evaluate phase), the precharge transistor 202 turns off and transistor 204 turns on. As in the example given above, if both input signals A and B represent a logic 0, there complements will be logic 1, and both NMOS transistors 206 and 208 are turned on. With both transistor 206 and 208 turned on, NAND output node 210 is pulled to the logic-low level of ground. Inverter 108 inverts the signal producing a logic 1 state at R1.

Dynamic logic NAND gates are often used in decoders because of the inherent high-speed of dynamic logic. In the examples above, 2:4 NAND decoders are shown, but as larger decoders are desired, the number of fan-ins on each NAND gate also increase. Thus, for a 4:16 NAND decode, two additional NMOS transistors are added to the stack, in series with transistors 206 and 208. However, as more transistors are added to the stack, the resistance of the pull down path increases because there are more transistors. The added resistance in turn makes the response of the NAND gate slower. Alternatively, as transistors are added to the stack, the size of the transistors increases to reduce the resistance of each individual transistor while keeping the overall resistance of the stack constant. However, larger transistors consume more space and lead to larger input capacitances which slow the circuit's response. Moreover, each additional transistor in a stack has a voltage drop across it, and so the top transistors in the stack have increasingly higher source voltages during switching and correspondingly deteriorated switching performance.

One solution to these problems associated with increased fan-in is to shift from a NAND decoder to a NOR decoder. FIG. 3 illustrates a prior art 2:4 NOR decoder. The decoder has two address input lines A and B and four decode lines R1, R2, R3, and R4. Complements of the input signals are produced by inverters 302 and 304. If signals A and B both represent a logic 0, (00 being the address for decode line R1) then NOR gate 306 receives logic 0 at both of its inputs and produces a logic 1 signal as output. Thus, this device is said to be active-high, because the active state is logic 1. Under the same input conditions, the remaining NOR gates resolve to logic 0, at decode outputs R2–R4. Similarly, inputs of 01, 10, and 11 would produce the logic 1 state at outputs R2, R3, and R4, respectively. This NOR decoder scheme is also referred to as a one-hot-decode because only one decode output (the selected output) is in the logic 1 state.

FIG. 4 shows an example of a dynamic logic implementation for the NOR gate 306 of FIG. 3. In operation of this circuit, when the clock signal φ is low (precharge phase), PMOS transistor 402 is conducting and the decode output line is precharged to the logic-high level of $V_{DD}$. When the clock signal φ becomes high (evaluate phase), the precharge transistor 402 turns off. As in the example of the NOR decoder given above, if both input signals A and B represent a logic 0, both NMOS transistors 406 and 408 are turned off. With both transistors 406 and 408 turned off, NOR output node 410 and decode line R1 (buffered by inverters 412 and 414) remain at the logic-high level of $V_{DD}$.

A NOR decoder has several advantageous characteristics. For larger decodes, additional fan-ins are added to the NOR gates. Thus, for a 4:16 NOR decoder, two additional NMOS transistors are added in parallel with transistors 406 and 408. Because the transistors are added in parallel, the total resistance encountered during the evaluate phase does not increase, and the NOR decoder resolves more quickly than the NAND decoder.

Dynamic NOR gates used in a decode circuit have a significant drawback. During the precharge phase, PMOS transistor 402 is conducting and the decode output line is precharged to the logic-high level. Thus, during the precharge phase, all of the decode outputs R1–R4 are high, thereby violating the one-hot-decode condition as seen in the aforementioned NAND decoder. This feature is undesirable for a variety of reasons. For example, if the decoder is used to address a random access memory (RAM) array, the prior art NOR decoder has a precharge phase with all of the word lines asserted, thereby decoding all of the word lines at a time when decode is not requested. Additionally, asserting all of the decode lines during precharge can short all of the memory cells together, thereby leading to data corruption.

Accordingly, it is desirable to have a circuit that has the advantages previously discussed, while at the same time ensuring that, during a precharge phase, the output of the NOR gate is inactive.

SUMMARY OF THE INVENTION

It has been discovered that a circuit retains the advantageous properties of a NOR gate circuit while ensuring an inactive output during precharge by coupling the output of a first NOR gate to the first input of a NAND gate, and by a cross-coupling the output of a second NOR gate through a first inverter and into the second input of a NAND gate. The output of the NAND gate is coupled to a second inverter. The second NOR gate is configured in a manner similar to the first, so that the two NOR gates form a NOR gate pair. This NOR gate pair exploits the fact that in a one-hot-decode decoder, if a decode output is active (i.e. that decode output was selected by the input addresses) then the output of the decode line coupled to the desired line is inactive, as are all other decode lines.

Accordingly, one aspect of the present invention provides a NOR gate pair. A first NOR gate has a plurality of inputs and an output. A second NOR gate has a plurality of inputs and an output. A first NAND gate has a first input, a second input, and an output. The first input of the NAND gate is coupled to the output of the first NOR gate, and the second input of the NAND gate is coupled to the output of the second NOR gate through a first input inverter. A second NAND gate has a first input, a second input, and an output. The first input of the second NAND gate is coupled to the output of the second NOR gate. The second input of the second NAND gate is coupled to the output of the first NOR gate through a second input inverter. A first output inverter is coupled to the output of the first NAND gate. A second output inverter is coupled to the output of the second NAND gate.

In another aspect of the invention, a decoder circuit capable of being in a precharge phase and capable of being in an evaluate phase includes a first logic circuit, a second logic circuit, and a monitoring circuit. The first logic circuit is capable of receiving a first plurality of address input signals and capable of providing a first output signal. The second logic circuit is capable of receiving a second plurality of address input signals and capable of providing a second output signal. The monitoring circuit is capable of receiving the first and second output signals and providing a first and a second address output signal. The first and second address output signals are inactive during the precharge phase.

In still another aspect of the invention, an integrated circuit includes a plurality of memory elements, and a decoder circuit (as described above) coupled to the plurality of memory elements for decoding at least one of the plurality of memory elements.

In yet another aspect of the invention, a decoder circuit capable of being in a precharge phase and capable of being in an evaluate phase includes a first logic circuit and a second logic circuit. The first logic circuit is capable of receiving a first plurality of address input signals and capable of providing a first output signal. The second logic circuit is capable of receiving a second plurality of address input signals and capable of providing a second output signal. The decoder circuit also includes a means for comparing the first and the second output signals to provide an inactive address output signal during the precharge phase.

In another aspect of the invention, a method of replacing active address output signals with inactive address output signals in a one hot decode circuit providing a plurality of address output signals is disclosed. A first address output signal is selected from the plurality of address output signals. A second address output signal is selected from the plurality of address output signals. Using a logic circuit, the first address output signal is compared with the second address output signal to determine if both signals are active. The first address output signal and the second address output signal are replaced with inactive signals when both the first address output signal and the second address output signal are active.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 5:
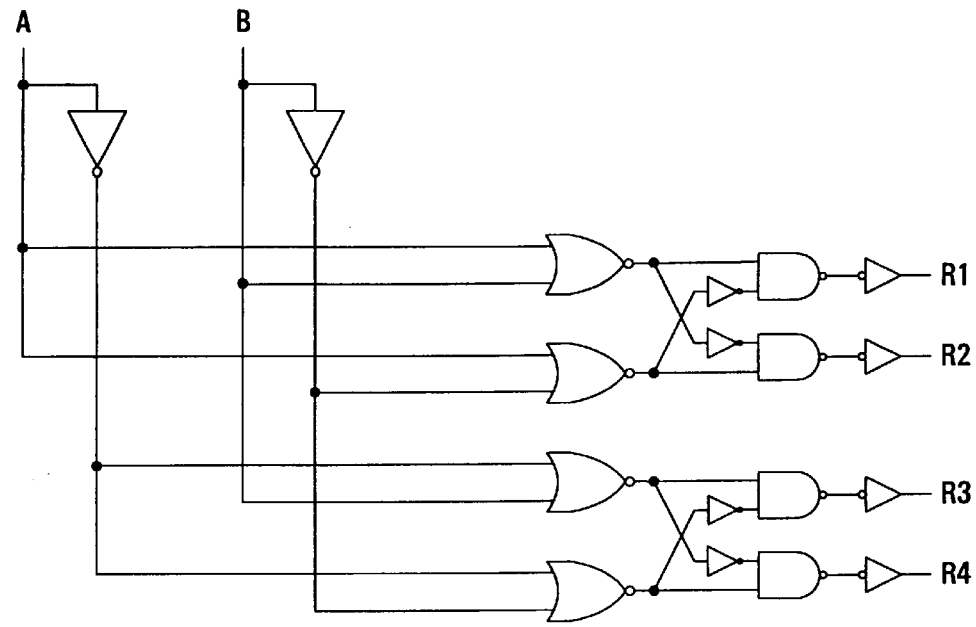
FIG. 5 is a logic diagram of a 2:4 NOR decoder using the NOR gate pairs of an embodiment of the present invention.
Figure 6:
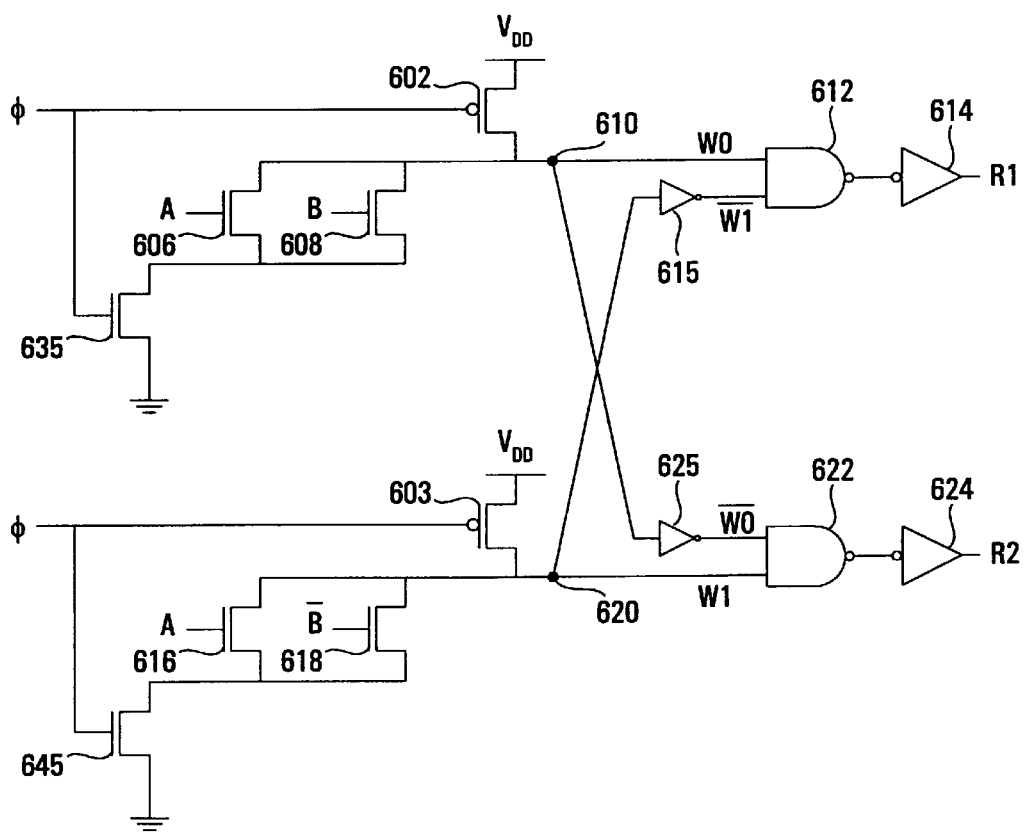
FIG. 6 is a circuit diagram of the two input dynamic logic NOR gate of the an embodiment of present invention.

The NOR gate pair of an embodiment of the present invention is shown in FIG. 6. The circuit shown in FIG. 6 represents a dynamic NOR gate pair used in the 2:4 decoder of FIG. 5. For simplicity's sake, the 2:4 decoder structure is used as an example, however those of ordinary skill in the art will readily recognize that the NOR gate pair and decoder of the present invention is not limited to use in the 2:4 architecture, and may be implemented in a decoder architecture as large as n:$2^n$, i.e. a decoder with n address inputs and $2^n$ decode outputs.

The first NOR gate of the NOR gate pair includes NMOS transistors 606 and 608 connected in parallel between the drain of NMOS transistor 635 and the source of PMOS transistor 602. The gates of transistors 606 and 608 receive input signals from the decoder address lines. For NOR gate pairs used in larger decoder circuits, e.g. a 4:16 decoder, additional NMOS transistors are connected in parallel with transistors 606 and 608. The gate of transistor 602 is coupled to a clock or other precharge signal, and the drain is tied to a power source line at voltage $V_{DD}$. The gate of transistor 635 is coupled to a clock or other precharge signal, and the source is tied to ground. The second NOR gate has a similar structure including NMOS transistors 616, 618, and 645, and PMOS transistor 603. The output node 610 of the first NOR gate is coupled to one input of the two input NAND gate 612. Output node 610 is also cross-coupled through inverter 625 to one input of NAND gate 622. Similarly, he output node 620 of the second NOR gate is coupled to the second input of the two input NAND gate 622 and cross-coupled through inverter 615 to the second input of NAND gate 612. The output of NAND gate 612 is inverted by inverter 614, and the output of NAND gate 622 is inverted by inverter 624.

In operation of this circuit, when the clock signal φ is low (precharge phase), PMOS transistors 602 and 603 are conducting and the decode output nodes 610 and 620 are precharged to the logic-high level of $V_{DD}$. Transistors 635 and 645 are turned off so that no current flows regardless of the voltage values at the gates of transistors 606, 608, 616, and 618. NAND gate 612 receives logic-high (1) at a first input terminal, and logic-low (0) at a second input terminal, the latter being the case because the logic-high level at output node 620 is inverted by inverter 615 which is coupled to the second input of NAND gate 612. With inputs of 1 and 0, NAND gate 612 has an output of 1, which in turn is inverted by inverter 614 to yield a logic-low or 0 signal. Thus, during the precharge phase, the output from the first NOR gate is logic-low, as desired. Similarly, during the precharge phase the output from the second NOR gate of the NOR gate pair is also logic-low.

Figure 1:
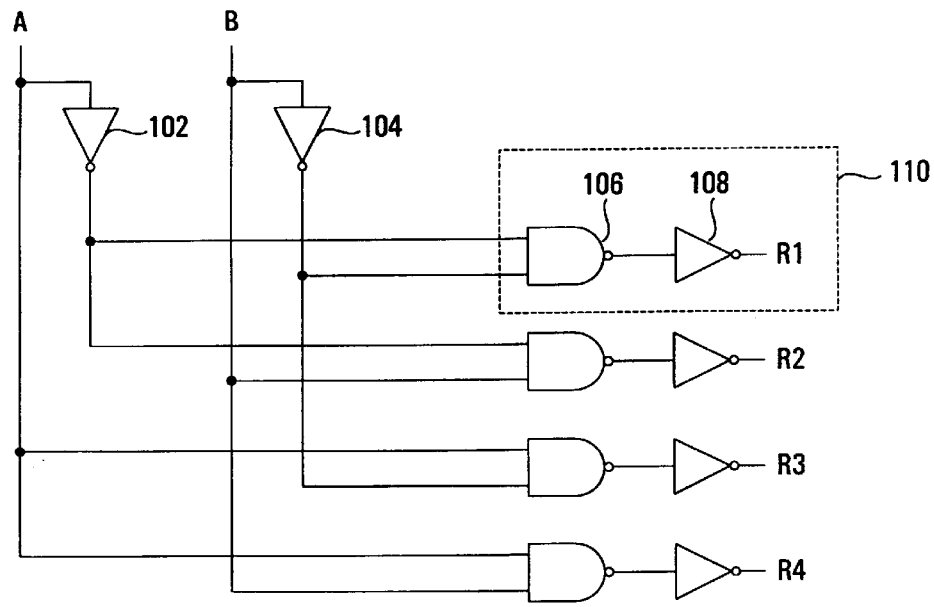
FIG. 1 is a logic diagram of a prior art 2:4 NAND decoder.
Figure 2:
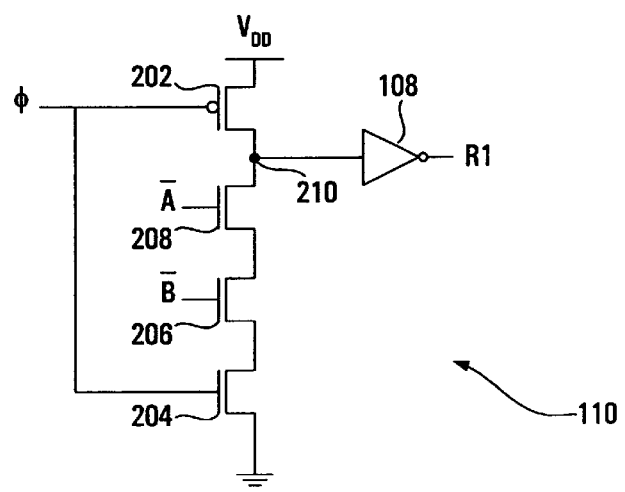
FIG. 2 is a circuit diagram of a prior art two input dynamic logic NAND gate.
Figure 3:
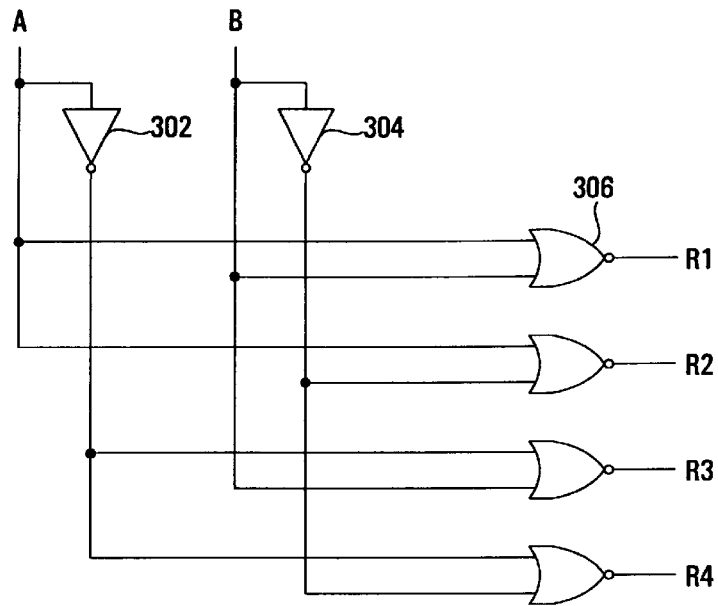
FIG. 3 is a logic diagram of a prior art 2:4 NOR decoder.
Figure 4:
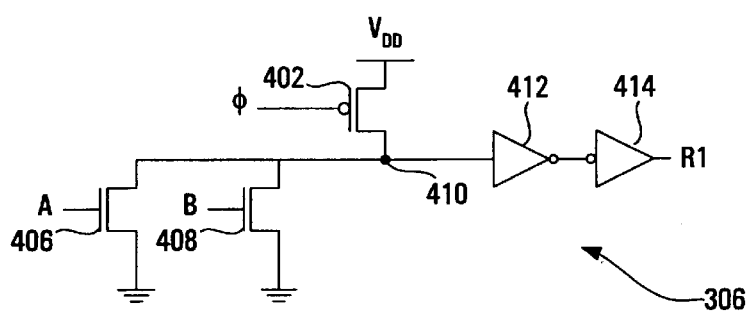
FIG. 4 is a circuit diagram of a prior art two input dynamic logic NOR gate.

When the clock signal φ becomes high (evaluate phase), the precharge transistors 602 and 603 turn off and transistors 635 and 645 turn on. As in the example of the NOR gate and decoder of FIGS. 3–4, if both input signals A and B represent a logic 0, both NMOS transistors 606 and 608 are turned off. With both transistors 606 and 608 turned off, NOR output node 610 remains at the logic-high level of $V_{DD}$. NMOS transistor 616 is also turned off, but since transistor 618 receives the complement to signal B, i.e. 1 in this case, it is turned on. With transistor 618 turned on, output node 620 is pulled to ground (through transistor 645), or the logic-low level. NAND gate 612 receives a logic 1 from output node 610, and a logic 1 from the output of inverter 615, i.e. the logic 0 signal from node 620 is inverted. With inputs of 1 and 1, NAND gate 612 resolves a 0 which in turn is inverted by inverter 614. Thus, when the address input is 00, the appropriate logic-high signal is asserted through the decode output. Note also that NAND gate 622 receives a 0 from node 620 and a 0 from the output of inverter 625, thereby producing a logic-high output which is inverted by inverter 624.

When operating under the constraint of a one-hot-decode decoder, the NOR gate pair of the present invention takes advantage of the fact that if a particular decode line is selected, its neighbor must be not-selected. The cross-coupling shown in FIGS. 5–6 preserves the advantage of NOR gates while at the same time eliminating the disadvantage that all decode lines are asserted during precharge.

The signal pairs W0 & $\overline{W1}$, and $\overline{W0}$ & W1 represent the inputs to NAND gates 612 and 622 respectively. Under some conditions, a race condition may occur. For example, if both signals W0 and W1 are falling from the logic high to the logic low level, W0 will be falling as $\overline{W1}$ is rising. Under some conditions W0 may fall to the logic low state before or after $\overline{W1}$ rises to the logic high state, leading to one signal racing the other. A variety of different approaches can be taken to eliminate this problem.

In one approach, the speed at which signals W0 and W1 fall is balanced. For example, transistors 635 and 645 can be made small so as to limit the pull-down current and therefore the W0 and W1 edge rates. Alternatively, NOR decoder pairs can be designed to be different by no more than one term. For example, if each of the NOR decoders had three inputs (e.g. for a 3:8 decode) and the three inputs of the first NOR gate of the pair receive signals A, B and C, then the three inputs of the second NOR gate of the pair would receive either A, B, and $\overline{C}$; A, $\overline{B}$, and C; or $\overline{A}$, B, and C. This approach can lead to higher speed of operation, but may be more difficult to design. Another approach to solving the problem of race conditions is to slow down the output rise time of the inverters 615 and 625. However, this approach may reduce operating speed. Still another approach to eliminating the race condition, is to increase the pull-down speeds associated with signals W0 and W1. This approach will improve operating speed, but may require increased transistor area. Yet another approach would involve some combination of the three other approaches given.

The present invention has been discussed in terms of use in dynamic logic circuits. However, those of ordinary skill in the art will readily recognize that the OR gate pairs and decoder of the present invention can be used with other types of logic, for example rationed logic. Moreover, the NOR gate pairs of the present invention can be used anywhere mutual-exclusivity of the paired lines is involved. Additionally, those of ordinary skill in the art will readily recognize that the transistors types other than MOS transistors can be used to implement the NOR gate pair and decoder of the present invention. Although FIGS. 5 and 6 show the NOR gate pairs located side-by-side, the NOR gates need not be located adjacent to each other.

While the invention has been described in light of the embodiments discussed above, one skilled in the art will recognize that certain substitutions may be easily made in the circuits without departing from the teachings of this disclosure. For example, a variety of logic gate structures may be substituted for those shown, and still preserve the operation of the circuit. Such equivalents are well known to those of ordinary skill in the art, and may readily be ascertained by proper application of DeMorgan's theorem and other well known logic identities. For example, NAND gate 612 and inverter 614 may be replaced with an AND gate. As another example, NAND gate 612 with no inverter on its first input, inverter 615 on its second input, and inverter 614 on its output is logically equivalent to a NOR gate with an inverter on its first input and no inverter on its second input or output. Also, many circuits using NMOS transistors may be implemented using PMOS transistors instead, as is well known in the art, provided the logic polarity and power supply potentials are reversed. In this vein, the transistor conductivity-type (i.e., N-channel or P-channel) within a CMOS circuit may be frequently reversed while still preserving similar or analogous operation.

Figure 7:
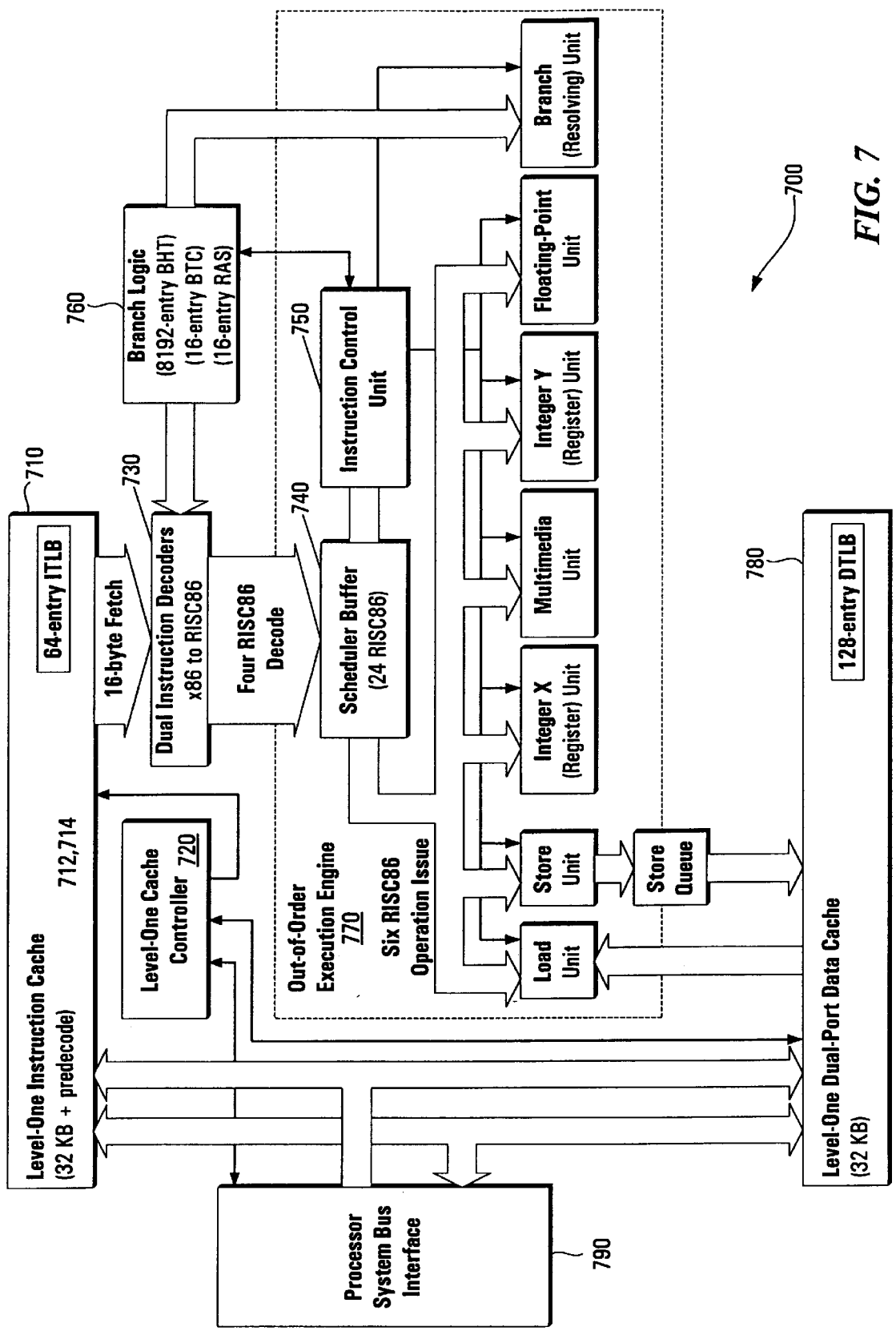
FIG. 7 is an architectural block diagram which illustrates an embodiment of a processor in accordance with an embodiment of the present invention.

The NOR gate pair and decoder of the present invention can be used in variety of circuits and devices. For example, FIG. 7 is a block diagram illustrating an embodiment of an AMD-K6 processor 700. The processor 700 is an ×86 instruction set-compatible microprocessor implementing a set of Multi-Media extensions (MMX). A level-one (L1) instruction cache 710 begins predecoding instructions obtained from a processor system bus interface during filling of the 32 KB two-way associative L1 instruction cache 710. The L1 instruction cache 710 includes a 64-entry instruction translational lookahead buffer (ITLB). Bypass (not shown) and storage buffers (not shown) for instructions (4×16) and predecode (4×20) to the L1 instruction cache 710 are supplied to allow data-in and data flow-back to cache output terminals.

A level-one cache controller 720 controls caching in the L1 instruction cache 710. The L1 instruction cache 710 uses a Most Recently Used (MRU) prediction technique to predict the way selection on cache accesses. A misprediction in the way selection results in a penalty of one cycle. The L1 instruction cache 710 line replacement algorithm is Least Recently Used (LRU) although an alternative random replacement algorithm is supported. The L1 instruction cache 710 also supports a direct-mapped replacement algorithm, reducing the cache size from 32 KB to 16 KB.

The L1 instruction cache 710 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The processor 700 includes predecode logic 712 and a predecode cache 714 to identify instruction boundaries and fill the L1 instruction cache 710. Once the L1 instruction cache 710 is filled, predecode bits are stored in the 20 KB predecode cache 714. Predecode bits resolved during the predecoding operation are stored in a 20 KB predecode cache 714. Predecode logic 712 includes a first stage of instruction decode logic. Data from the L1 instruction cache 710 are fetched by fetch logic 712 and transferred to dual instruction decoders 730. The dual instruction decoders 730 decode up to two x86 instructions per clock and translate most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 730 are transferred to a RISC86 Op scheduler and buffer 740. The RISC86 Op scheduler 740 holds up to 24 RISC Ops and stores a total of 48 registers using register renaming. Scheduler 740 contains logic to track instructions from decode to retirement, determining dependencies, scheduling execution, and committing architectural state. Scheduler 740 is structured as a FIFO queue with instructions entering the queue four at one time to match the macroinstruction decoder bandwidth and up to four instructions retiring at one time at the end of the queue. Instructions enter scheduler 740 after decoding or fetching and remain in the scheduler queue until retirement. Scheduler 740 queue is a general structure used for all categories of instructions and thus serves to hold instructions directed to different execution units. Scheduler 740 utilizes implicit register renaming, which is based on position within the queue rather than explicit tag assignments, so that scheduler 740 avoids usage of full renaming hardware.

Scheduler 740 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp [7:0] terms 3-RISC86 Op groups. The selection of 3-RISC86 Op groups is convenient since 24 RISC86 Ops are allocated in the scheduler 740. The eight group terms are combined in a three-level tree to create a group carry in terms Cgrp[7:0]. The group carry terms Cgrp[7:0] are used within each group to select the operand source Op.

The RISC86 Op scheduler 740, under control of an instruction control unit 750, issues up to six RISC86 operations using out-of-order issuing to seven parallel execution units. The execution units speculatively execute the RISC86 Ops to generate results. The RISC86 Op scheduler 740 retires the results in-order. The execution units include a load unit, a store unit, an integer X register unit, a Multi-Media extension (MMX) unit, an integer Y register unit, a floating-point unit (FPU), and a branch resolving unit. A branch logic unit 760 implements a branch prediction operation that uses two-level branch prediction based on an 8192-entry Branch History Table (BHT), a 16-entry Branch Target Cache (BTC), and a 16-entry Return Address Stack (RAS).

The dual instruction decoders 730 translate x86 instructions on-the-fly into corresponding RISC86 Ops. The RISC86 Ops are executed by an instruction core 770 that is essentially a RISC superscalar processing or execution engine. The fetch logic fetches up to sixteen instruction bytes each cycle from the L1 instruction cache 710 and transfers the instruction bytes into an instruction buffer (not shown) preceding the dual instruction decoders 730 so that the instruction buffer is maintained at capacity. The dual instruction decoders 730 access the instruction bytes from the instruction buffer, decode up to two x86 instructions, immediately recognize and predict branches, and generate up to four RISC86 Ops. The RISC86 Ops are loaded into the unified RISC86 Op scheduler 740. The RISC86 Op scheduler 740 controls and tracks multiple aspects of RISC86 Op issue and execution.

The microprocessor 700 executes up to six operations per clock. Each cycle, up to six RISC86 Ops are issued and executed in a pipelined manner. The six RISC86 Ops may include one memory read operation, one memory write operation, two integer operations and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op scheduler 740, functioning as a reorder buffer, commits the RISC86 Ops in-order to ensure precise exception handling and full operational compatability with x86 architecture standards. The RISC86 Op scheduler 740 performs implicit register renaming based upon position within the scheduler buffer (queue) rather than explicit tag assignments that are conventionally employed in systems that use a reorder buffer. The position-based register renaming reduces the size of renaming hardware. The RISC86 Op scheduler 740 has a first-in-first-out (FIFO) buffer physical structure and performs implicit register renaming, characteristics which, in combination, advantageously permit the use of fast positionbased instruction issue and dependency-tracking logic. The dependency-tracking logic has characteristics of many fast adder circuits in which the process of searching for a particular operand is similar to the arithmetic operation of propagating a carry through an adder.

The load unit loads data via a level-one (L1) dual-port data cache 780 which receives data from an external memory (not shown) via the processor system bus interface 790. Bypass (not shown) and storage buffers (not shown) for data (4x16) to the data cache 780 are supplied to allow data-in and data flow-back to cache output terminals.

The data cache 780 includes a 128-entry data translational lookahead buffer (DTLB). The data cache 780 is a 2-way set-associative, 32 KB size cache with a 64 byte line-size and 32-byte sub-blocking. The data cache 780 fills on the basis of the 32-byte sub-block units. In contrast to the L1 instruction cache 710, the data cache 780 uses a Least Recently Missed (LRM) selection technique which is generally a more accurate selection scheme than the LRU technique of the L1 instruction cache 710. In the LRM scheme, the line that first enters the cache is replaced. An alternative random replacement algorithm is supported. The data cache 780 also supports a direct-mapped replacement algorithm, reducing the cache size from 32 KB to 16 KB.

The data cache 780 supports write allocation, which is disabled by setting a configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 780 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls. The store unit transfers data to the data cache 780 through a store queue.

The Multimedia unit is implemented to incorporate an x86 instruction subset called the Multi-Media extensions (MMX) thereby supporting a growing number of applications in the areas of communications and multimedia. The multimedia unit supports the new instructions and the new data types that are defined by the MMX standard to increase processor performance in the targeted applications. The multimedia unit executes a Single Instruction, Multiple Data (SIMD) technique to process multiple operands of 8, 16, or 32 bits in a 64-bit data path to perform highly parallel and computationally intensive algorithms that are typical for multimedia applications. The multimedia unit supports 57 new instructions that execute additions, subtractions, multiplies, multiply-accumulates, logical shifts, arithmetic shifts, and several other operations. Most operations are executed on operands of any data type.

The NOR gate pair and decoder of the present invention can be implemented in processor 700 wherever decode functions are required, including instruction cache 710, dual instruction decoders 730, data cache 780, and execution engine 770. Additionally, the decoder of the present invention can be used to decode ROM-resident sequences of RISC Ops. Those of ordinary skill in the art will recognize a variety of potential uses for the NOR gate pair and decoder of the present invention in processor 700.

Figure 8:
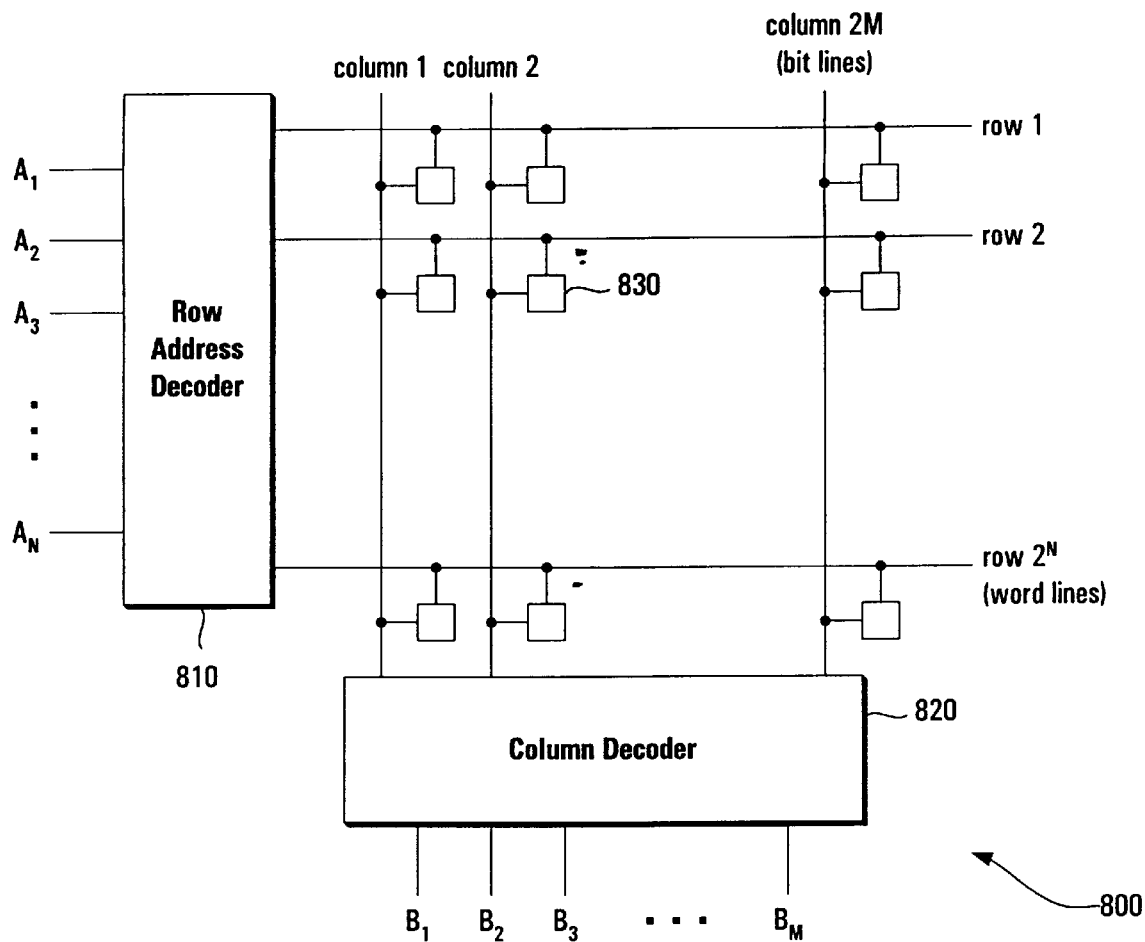
FIG. 8 is a block diagram of an integrated circuit in accordance with an embodiment of the present invention.

The NOR gate pair and decoder of the present invention can be implemented in a wide variety of integrated circuits. FIG. 8 shows a block diagram of randomaccess memory (RAM) array 800 with memory cells 830, row decoder 810, and column decoder 820. The NOR gate decoder of the present invention is used for row decoder 810 and column decoder 820. To access a particular memory cell, the corresponding bit line and word line must be activated. This is accomplished by selecting the appropriate address lines in decoders 810 and 820. FIG. 8 shows decoders that are N:$2^N$ and M:$2^M$ respectively, but those of ordinary skill in the art will recognize that the NOR decoder of the present invention may take different configurations. Moreover, the NOR decoder of the present invention may be used to decode RAM cells as shown in FIG. 8, as well as read-only memories (ROMs).

A wide variety of computer system configurations are envisioned, each embodying the above-described NOR gate pair in accordance with an embodiment of the present invention. For example, one such computer system includes integrated circuit microprocessor 700 in accordance with the present invention, a memory subsystem (e.g., RAM), a display adapter, disk controller/adapter, various input/output interfaces and adapters, and corresponding external devices. Memory, adapters and interfaces are conventionally coupled to integrated circuit microprocessor 700 (e.g., via busses).

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A NOR gate pair comprising:
   a first NOR gate having a plurality of inputs and an output;
   a second NOR gate having a plurality of inputs and an output;
   a first NAND gate having a first input, a second input, and an output, the first input being coupled to the output of the first NOR gate, the second input being coupled to the output of the second NOR gate through a first input inverter;
   a second NAND gate having a first input, a second input, and an output, the first input being coupled to the output of the second NOR gate, the second input being coupled to the output of the first NOR gate through a second input inverter;
   a first output inverter coupled to the output of the first NAND gate; and
   a second output inverter coupled to the output of the second NAND gate, wherein each of the plurality of inputs of the first NOR gate receives a respective signal and each of the plurality of inputs of the second NOR gate receives a respective signal, and wherein all but one of the signals received by the first NOR gate are among the signals received by the second NOR gate.

2. The NOR gate pair of claim 1 wherein the first and second NOR gates are rationed logic NOR gates.

3. The NOR gate pair of claim 1 wherein the first and second NOR gates are dynamic NOR gates.

4. The NOR gate pair of claim 3 wherein the first and second dynamic NOR gates further comprise a plurality of MOSFETs.

5. A decoder circuit capable of being in a precharge phase and capable of being in an evaluate phase, the decoder circuit comprising:
   a first logic circuit capable of receiving a first plurality of address input signals and capable of providing a first output signal;

a second logic circuit capable of receiving a second plurality of address input signals and capable of providing a second output signal; and a monitoring circuit capable of receiving the first and second output signals and providing corresponding first and second address output signals, the monitoring circuit using the first and second output signals to ensure that the first and second address output signals being inactive during the precharge phase, wherein all but one of the first plurality of address input signals are among the second plurality of address input signals.

6. The decoder circuit of claim 5 further comprising:

a precharge circuit, the precharge circuit for precharging the first and the second logic circuit in response to a precharge signal.

7. The decoder circuit of claim 5 wherein the first logic circuit is a NOR gate, the second logic circuit is a NOR gate, and the monitoring circuit further comprises:

a first NAND gate having a first input terminal, a second input terminal, and an output terminal, the first input terminal being capable of receiving the output signal of the first NOR gate, the second input terminal being capable of receiving the output signal of the second NOR gate through a first input inverter; and a first output inverter coupled to the output terminal of the first NAND gate.

8. The decoder circuit of claim 7 further comprising:

a second NAND gate having a first input terminal, a second input terminal, and an output terminal, the first input terminal being capable of receiving the output signal of the second NOR gate, the second input terminal being capable of receiving the output signal of the first NOR gate through a second input inverter; and a second output inverter coupled to the output terminal of the second NAND gate.

9. The decoder circuit of claim 7 wherein the first and second NOR gates are rationed logic NOR gates.

10. The decoder circuit of claim 7 wherein the first and second NOR gates are dynamic NOR gates.

11. The decoder circuit of claim 10 wherein the first and second dynamic NOR gates further comprise a plurality of MOSFETs.

12. An integrated circuit chip comprising:

a plurality of memory elements; and a decoder circuit coupled to the plurality of memory elements and capable of being in a precharge phase and capable of being in an evaluate phase, the decoder circuit including:

a first logic circuit capable of receiving a first plurality of address input signals and capable of providing a first output signal;

a second logic circuit capable of receiving a second plurality of address input signals and capable of providing a second output signal; and a monitoring circuit capable of receiving the first and second output signals and providing corresponding first and second address output signals, the monitoring circuit using the first and second output signals to ensure that the first and second address output signals being inactive during the precharge phase, wherein all but one of the first plurality of address input signals are among the second plurality of address input signals.

13. The integrated circuit chip of claim 12 wherein the first logic circuit is a NOR gate, the second logic circuit is a NOR gate, and the monitoring circuit further comprises:

a first NAND gate having a first input terminal, a second input terminal, and an output terminal, the first input terminal being capable of receiving the output signal of the first NOR gate, the second input terminal being capable of receiving the output signal of the second NOR gate through a first input inverter; and a first output inverter coupled to the output terminal of the first NAND gate.

14. The integrated circuit chip of claim 13 further comprising:

a second NAND gate having a first input terminal, a second input terminal, and an output terminal, the first input terminal being capable of receiving the output signal of the second NOR gate, the second input terminal being capable of receiving the output signal of the first NOR gate through a second input inverter; and a second output inverter coupled to the output terminal of the second NAND gate.

15. The integrated circuit chip of claim 13 wherein the first and second NOR gates are rationed logic NOR gates.

16. The integrated circuit chip of claim 13 wherein the first and second NOR gates are dynamic NOR gates.

17. The integrated circuit chip of claim 16 wherein the first and second dynamic NOR gates further comprise a plurality of MOSFETs.

18. An integrated circuit chip, as recited in claim 12, wherein the integrated circuit chip comprises an integrated circuit microprocessor chip with a cache memory block defining the plurality of memory elements.

19. An integrated circuit chip, as recited in claim 12, wherein the integrated circuit chip comprises an integrated circuit microprocessor chip including:

an execution engine; and an instruction decoder coupled to the execution engine, the instruction decoder decoding instructions and supplying operations to the execution engine for execution, wherein at least one of the execution engine and the instruction decoder includes a memory block defining the plurality of memory elements.

20. An integrated circuit chip, as recited in claim 12, wherein the integrated circuit chip comprises a memory chip with a memory block thereon defining the plurality of memory elements.

21. An integrated circuit chip, as recited in claim 12, coupled into a computer system having a processor, a memory and a bus coupled therebetween, the integrated circuit chip including circuits of at least one of the processor and the memory.

22. The integrated circuit chip of claim 12 wherein the plurality of memory elements are read only memory elements.

23. The integrated circuit chip of claim 12 wherein the plurality of memory elements are random access memory elements.

* * * * *

UNITED STATES PATENT AND TRADEMARK OFFICE
CERTIFICATE OF CORRECTION

PATENT NO. : 6,081,136
DATED : June 27, 2000
INVENTOR(S) : Khanna, Rajesh; Partovi, Hamid It is certified that error appears in the above-identified patent and that said Letters Patent is hereby corrected as shown below:

<u>Title page,</u>
References Cited, insert:
-- 4,048,629    9/77   Bormann..............340/173
   5,237,217    8/93   Hasegawa et al. ......307/463
   5,530,380    6/96   Kondoh................326/98
   5,353,424    10/94  Partovi et al..........395/425 --

<u>Column 10,</u>
Line 57, delete "rationed" and insert -- ratioed --.

<u>Column 11,</u>
Line 37, delete "rationed" and insert -- ratioed --.

<u>Column 12,</u>
Line 25, delete "rationed" and insert -- ratioed --.

Signed and Sealed this

Twentieth Day of November, 2001

Attest:

*Nicholas P. Godici*

NICHOLAS P. GODICI
*Attesting Officer*   *Acting Director of the United States Patent and Trademark Office*